（12) United States Patent
Ciubotaru (10) Patent No.: US 9,939,467 B1
(45) Date of Patent: Apr. 10, 2018

(54) WIDE-RANGE PRECISION RF PEAK DETECTOR

(71) Applicant: Analog Devices, Inc., Norwood, MA (US)

(72) Inventor: Alexandru Aurelian Ciubotaru, Somerset, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/293,615

(22) Filed: Oct. 14, 2016

(51) Int. Cl.
*G01R 19/04* (2006.01)
*G01R 21/01* (2006.01)
*G01R 29/08* (2006.01)

(52) U.S. Cl.
CPC .............. *G01R 19/04* (2013.01); *G01R 21/01* (2013.01); *G01R 29/08* (2013.01)

(58) Field of Classification Search
CPC ...... G01R 19/04; G01R 19/30; G01R 19/165; G01R 19/10; G01R 19/2506; G01R 19/0092; G01R 21/01; G01R 17/02; G01R 11/60; G01R 11/64; G01R 11/56; G01R 21/1338; G01R 1/203; G01R 31/2642
USPC ........ 324/103 P, 103 R, 117 R, 76.11–76.13, 324/76.41; 327/50, 52, 58, 65, 96, 62, 327/72, 77
See application file for complete search history.

(56) References Cited

U.S. PATENT DOCUMENTS

| 5,324,994 | A | * | 6/1994 | Sullivan | ................. | G01R 19/04 |
| | | | | | | 327/58 |
| 6,812,770 | B2 | * | 11/2004 | Filoramo | ............. | H03D 7/1433 |
| | | | | | | 327/359 |
| 7,355,456 | B2 | | 4/2008 | Kurtzman et al. | | |
| 8,604,879 | B2 | * | 12/2013 | Mourant | ................... | H03F 1/34 |
| | | | | | | 330/260 |
| 9,692,381 | B2 | * | 6/2017 | Tajalli | ................... | H03F 1/0205 |
| 2007/0030034 | A1 | * | 2/2007 | Kurtzman | .............. | G01R 19/04 |
| | | | | | | 327/58 |

(Continued)

OTHER PUBLICATIONS

"Encyclopedia of RF and Microwave Engineering—vol. 1", (2006), 4 pgs.

(Continued)

*Primary Examiner* — Thang Le
(74) *Attorney, Agent, or Firm* — Schwegman Lundberg & Woessner, P.A.

(57) ABSTRACT

An RF peak-detector circuit can operate over a wide range and can compensate or correct an output voltage error term that depends on the thermal voltage and the input signal voltage. At or near a minimum value of the input signal voltage range, such compensation can include a scaled base-emitter ratioing of bipolar junction transistors used to generate the output voltage, each of which can be biased by a primary current. At or near a maximum value of the input signal voltage range, this can include using an auxiliary bias current circuit that can shift auxiliary bias current between these bipolar junction transistors. The auxiliary bias current circuit can include scaled bipolar junction transistors in a cross-coupled configuration and an equivalent resistance circuit between emitters of the cross-coupled BJTs. This can provide a robust approach for improving the accuracy of an RF peak-detector circuit over a wide range.

20 Claims, 10 Drawing Sheets

(56) References Cited

U.S. PATENT DOCUMENTS

2012/0014423 A1* 1/2012 Mirzaei ............... H03G 3/3042
375/224
2014/0084995 A1* 3/2014 Hadji-Abdolhamid . H03F 3/245
327/543

OTHER PUBLICATIONS

"Keysight EEs of EDA Advanced Design System", Keysight Technologies, (Dec. 30, 2014), 1-16.
Ellinger, Frank, "Radio Frequency Intergrated Circuits and Tecnologies", Second Edition, (2008), 3 pgs.
Jaeger, Richard C., et al., "Microelectronic Circuit Design", Fourth Edition, (2011), 5 pgs.
Meyer, Robert G., "Low-Power Monolithic RF Peak Detector Analysis", IEEE Journal of Solid-State Circuits, vol. 30, No. 1, (Jan. 1995), 65-67.
Sobot, Robert, "Wireless Communication Electronics—Introdution to RF Circuits and Design Technologies", Chapter 12—AM and FM Signal Demodulation, (2012), 295-316.

* cited by examiner

WIDE-RANGE PRECISION RF PEAK DETECTOR

TECHNICAL FIELD

This document pertains generally, but not by way of limitation, to electrical integrated circuits and more particularly, but not by way of limitation, to a wide-range precision RF peak detector circuit and its method of use.

BACKGROUND

Peak detector circuits can find widespread uses in communication systems, such as for amplitude stabilization in oscillators, level measurement, demodulation, automatic tuning, automatic gain control, and power amplifier envelope tracking. Signals encountered in high-frequency narrowband systems can include either unmodulated sinusoids (e.g., in the case of oscillators), or modulated signals using a sinusoidal carrier. Peak detectors operating with such signals face conflicting requirements of precision, speed, dynamic range, and power consumption, but existing circuit topologies have limitations. Ensuring accuracy at low input levels is challenging. U.S. Pat. No. 7,355,456 provides an example of a complicated circuit attempting mathematical corrections to improve detector slope, but not accuracy.

SUMMARY

This document describes a robust approach for improving the accuracy of an RF peak-detector circuit over a wide range, which can involve adding only a small number of additional components.

An RF peak-detector circuit can operate over a wide range and can compensate or correct an output voltage error term that depends on the thermal voltage and the input signal voltage. At or near a minimum value of the input signal voltage range, such compensation can include a scaled base-emitter ratioing of bipolar junction transistors used to generate the output voltage, each of which can be biased by a primary current. At or near a maximum value of the input signal voltage range, this can include using an auxiliary bias current circuit that can shift auxiliary bias current between these bipolar junction transistors. The auxiliary bias current circuit can include scaled bipolar junction transistors in a cross-coupled configuration and an equivalent resistance circuit between emitters of the cross-coupled BJTs. This can provide a robust approach for improving the accuracy of an RF peak-detector circuit over a wide range.

This summary is intended to provide an overview of subject matter of the present patent application. It is not intended to provide an exclusive or exhaustive explanation of the invention. The detailed description is included to provide further information about the present patent application

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document

DETAILED DESCRIPTION

This document describes a robust approach for improving the accuracy of an RF peak-detector circuit over a wide range, which can involve adding only a small number of additional components. An output voltage error term that depends on the thermal voltage and the input signal voltage can be compensated or corrected at or near a minimum value of the input signal voltage range by a scaled base-emitter ratioing of bipolar junction transistors used to generate the output voltage, each of which can be biased by a primary current. This same error term can be compensated or corrected at or near a maximum value of the input signal voltage range by an auxiliary bias current circuit that can shift auxiliary bias current between these bipolar junction transistors. The auxiliary bias current circuit can have legs that can include further scaled bipolar junction transistors, which can be in a cross-coupled configuration, an equivalent resistance circuit between these legs, and bias currents for the cross-coupled bipolar junction transistors in the auxiliary bias current circuit. This can provide a robust approach for improving the accuracy of an RF peak-detector circuit over a wide range.

Figure 1A:
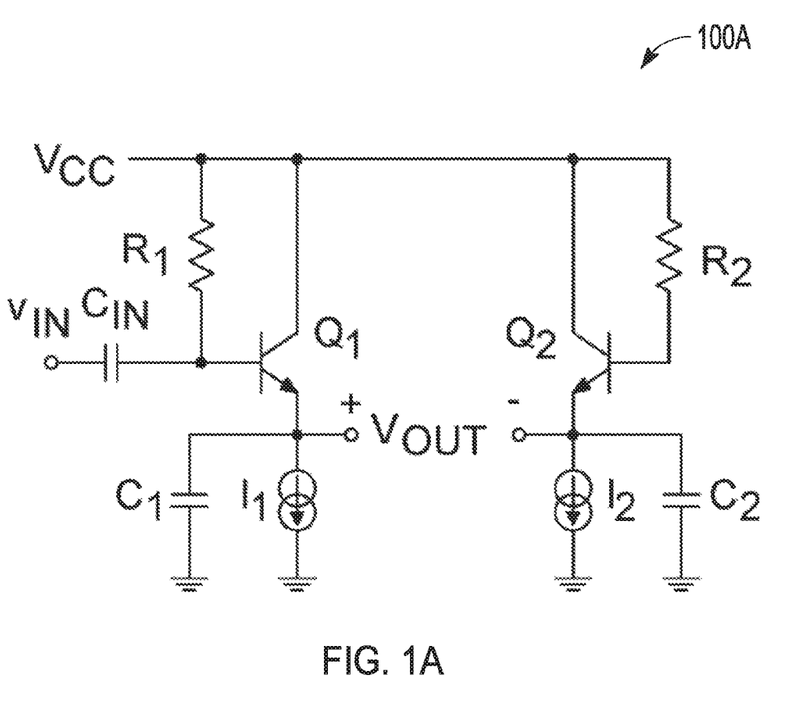
FIG. 1A shows an example of a portion of the present RF peak-detector circuit, with primary biasing but without auxiliary biasing.

FIG. 1A shows an example of a portion of the present RF peak-detector circuit 100A. In this example, the RF peak-detector circuit can include first and second transistors, such as npn bipolar junction transistors (BJTs) Q1, Q2. The transistors Q1 and Q2 can be respectively biased via resistors R1 and R2, which can connect their respective base terminals to an upper power supply rail voltage, Vcc. The transistors Q1 and Q2 can also be respectively biased by like-valued primary bias current sources I1 and I2 connected to their respective emitter terminals, with their respective collector terminals being connected to VCC. Capacitors C1 and C2 can be located between the respective emitter terminals of Q1 and Q2 and the negative power supply voltage rail, which is shown as ground in FIG. 1A. A capacitor CIN can be coupled to the base of the first transistor, Q1, such as to receive an AC-coupled RF input signal VIN for peak-detection. The output voltage, VOUT, can be taken between the respective emitters of the transistors Q1 and Q2.

For an input sinusoidal RF signal amplitude $V_{IN}$, with $C_{IN}$ a virtual short at the RF frequencies of interest, the AC-coupled RF bipolar peak detector portion shown in FIG. 1A has a DC output voltage of the form shown in Eq. 1.

$$V_{OUT} \cong V_{IN} - V_T \ln \sqrt{2\pi V_{IN}/V_T} \qquad (1)$$

In Equation 1, $V_T$ is the thermal voltage. The error term $V_T \ln \sqrt{2\pi V_{IN}/V_T}$ can be compensated to some degree at relatively large $V_{IN}$ by mismatching $Q_1$ and $Q_2$ (e.g., using different base-emitter junction areas), mismatching the current values of $I_1$ and $I_2$, or both.

Figure 1B:
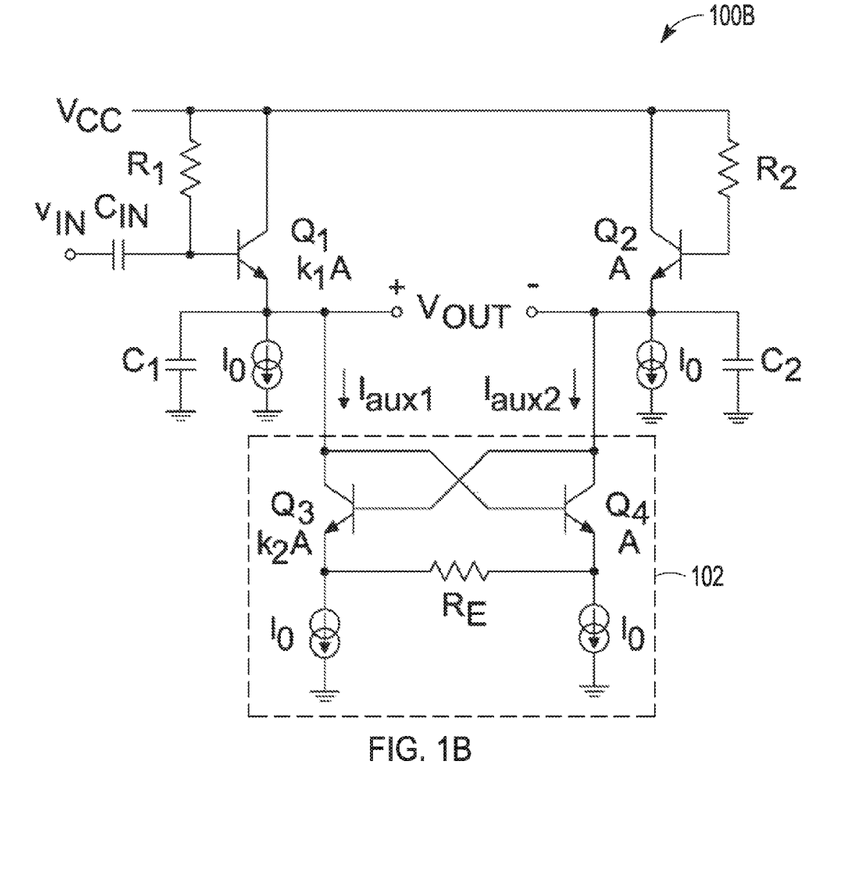
FIG. 1B shows an example of portions of the present RF peak-detector circuit, with primary biasing and also including auxiliary biasing.

FIG. 1B shows the RF peak-detector circuit 100B, which additionally includes an auxiliary biasing circuit 102 providing respective auxiliary bias currents Iaux1 and Iaux2 to the respective emitters of Q1 and Q2. The transistors Q1 and Q2 can have their base-emitter junction areas mismatched, so that the base-emitter junction area of Q1 is k1 times larger than the base-emitter junction area A of Q2, such as to obtain the error term cancellation described above, for example, using like-valued primary bias currents Io being supplied to each of the emitters of Q1 and Q2.

The auxiliary biasing circuit 102 can include third and fourth transistors, Q3 and Q4, such as npn bipolar transistors. The transistors Q3 and Q4 can be cross-coupled, such as with the base terminal of Q3 connected to the collector terminal of Q4 and to the emitter terminal of Q2, and with the base terminal of Q4 connected to the collector terminal of Q3 and the emitter terminal of Q1. In this way, the collector terminal of Q3 can provide the auxiliary current Iaux1 to the emitter terminal of Q1 and the collector terminal of Q4 can provide the auxiliary current Iaux2 to Q4, with control of these auxiliary currents depending, in part on each other using the cross-coupled base terminal connections of Q3 and Q4. An equivalent resistance circuit RE can be included between the emitter terminals of Q3 and Q4. The emitter terminals of Q3 and Q4 can be biased by like-valued bias current sources, which, in an example, can be like-valued (e.g., providing a bias current Io) to the primary bias current sources biasing the emitter terminals of Q1 and Q2.

Thus, as shown in FIG. 1B, mismatched-area transistors $Q_1$ and $Q_2$ can be initially biased by identical currents $I_0$, and two DC auxiliary currents $I_{aux1}$ and $I_{aux2}$ are generated as functions of $V_{OUT}$. Operation including the auxiliary biasing circuit 102 can be understood by first observing the effect of $I_{aux1}$ and $I_{aux2}$ in isolation from $Q_3$ and $Q_4$. At input amplitudes near the minimum of the input voltage range, such as $V_{IN} \cong 2V_T$ (minimum value for good accuracy of (1)), if $I_{aux1} = I_{aux2}$, then $Q_1$ and $Q_2$ conduct equal DC collector currents. Under these conditions, for a scaling factor $k_1 \cong 3.5$, the intentionally mismatched or scaled $Q_1$-$Q_2$ pair exhibits an offset voltage $V_{BE2} - V_{BE1} = V_T \ln k_1 \cong V_T \ln \sqrt{2\pi 2 V_T / V_T}$ which compensates the error term in (1). At large input amplitudes, such as toward the maximum of the input voltage range, e.g., $V_{IN} \cong 20 V_T$, if $I_{aux1} = 0$ and $I_{aux2} = 2.2 I_0 \cong 2 I_0$, then $V_{BE2} - V_{BE1} = V_T \ln k_1 (I_0 + I_{aux2})/I_0 \cong V_T \ln \sqrt{2\pi 20 V_T / V_T}$, again compensating the error term. For properly chosen scaling factor $k_2$ and equivalent resistance circuit resistance value $R_E$, the cross-coupled $Q_3$ and $Q_4$ can ensure the above conditions are met, can provide a gentle interpolation between the two states for $I_{aux1}$ and $I_{aux2}$, and can enable error compensation over a wide input amplitude range. Thus, area scaling factor $k_2$ can be chosen to ensure $I_{aux1} = I_{aux2} (= I_0)$ at $V_{IN} (\cong V_{OUT}) \cong 2 V_T$, by providing a compensating DC offset voltage for the $Q_3$-$Q_4$ pair such that $V_T \ln k_2 = 2 V_T$, yielding a value for the scaling factor $k_2 \cong 8$. Resistance value $R_E$ can initially be chosen such that $I_0 R_E$ is on the order of $4 V_T$ (which also makes $Q_3$-$Q_4$ fully tilted at $V_{IN} (\cong V_{OUT}) \cong 20 V_T$), but a more beneficial value can be found by numerical optimization. For practically zero DC offset due to the base currents of $Q_1$ and $Q_2$ at low input levels (where it is the most detrimental), $R_1 = R_2$ in FIG. 1b. However, both resistors must be small enough in order for this offset to also be negligible (relative to a larger $V_{OUT}$) at high input levels, where the collector currents of $Q_1$ and $Q_2$ can be mismatched by a factor of 3. The DC emitter current of $Q_1$ is a function of $V_{OUT} \cong V_{IN}$, with a worst-case value of $2 I_0$ occurring at low levels, which can be used in the calculation of the hold capacitance $C_1$ for a given allowable droop. At high levels, however, this current drops to $I_0$, and the droop is halved. Similarly, optional filtering capacitance $C_2$ can be selected in view of the emitter current of $Q_2$, which varies between $2 I_0$ and $3 I_0$. Topologically, although $Q_3$ and $Q_4$ are connected in a negative-resistance configuration, their purpose can be to provide currents in a large-signal scenario. The small-signal negative resistance presented by these devices can have an absolute value larger than the resistance otherwise presented by the emitters of Q1 and Q2, and therefore does not pose a stability problem.

In a given integrated-circuit technology, the above values for $k_1$, $k_2$, and $R_E$ (at a specified $I_0$) can be further optimized for minimum detector error over a wide range using a modern circuit simulator. For more general validity, however, using ideal (Gummel-Poon) exponential models for the transistors (without resistive or delay-related parasitics) is more appropriate in view of the dominant device behavior, which can be relevant up to at least several hundred MHz in modern processes. Performing such an optimization with ideal models for the circuit in FIG. 1b at 25° C. (room temperature), using the previously established initial values for $k_1$, $k_2$, and $R_E$, yields $k_1 = 3$, $k_2 = 6$, and $R_E = 827\Omega$, for $I_0 = 100$ μA and $V_{IN}$ in the range [50 mV, 500 mV].

Figure 2A:
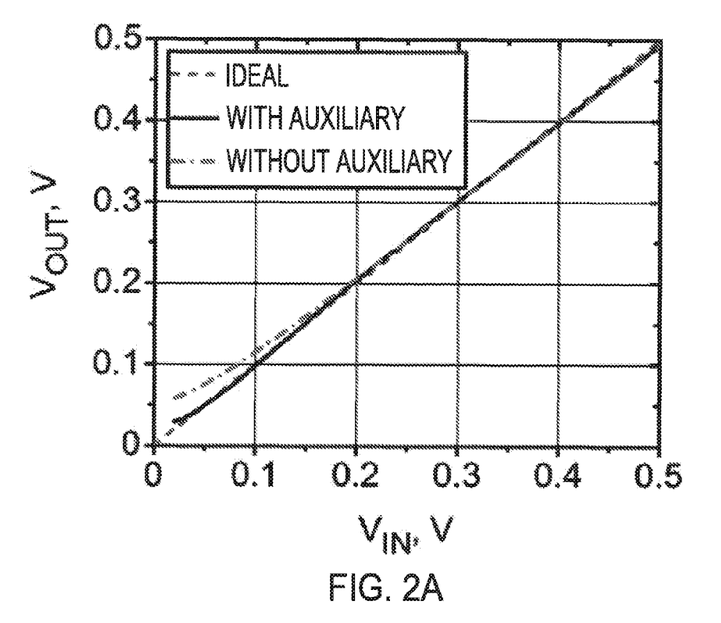
FIG. 2A shows an example of VOUT vs. VIN results of a computer simulation of the RF peak-detector circuits of FIGS. 1A and 1B.
Figure 2B:
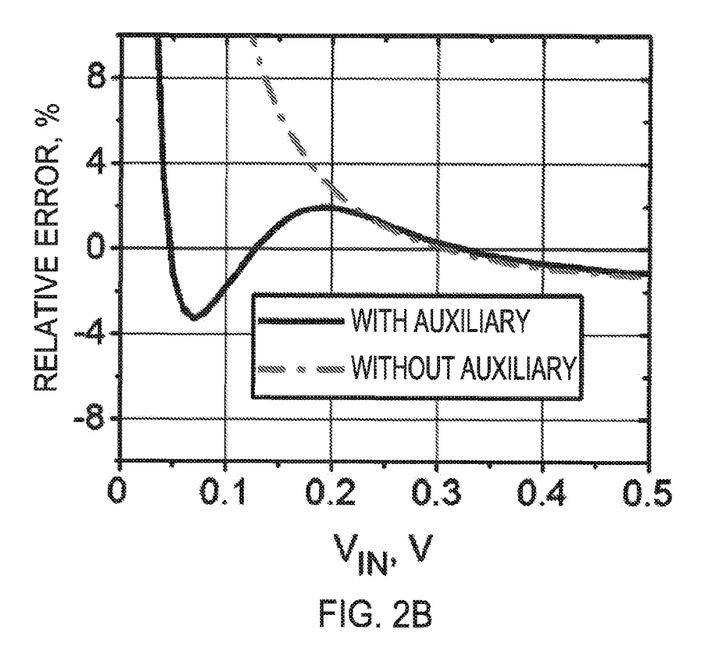
FIG. 2B shows an example of relative percentage error vs. VIN results of a computer simulation of the RF peak-detector circuits of FIGS. 1A and 1B.

Using the final optimization values and negligibly large $C_1$ and $C_2$, a comparison of the peak detectors of FIGS. 1a and 1b (with the circuit without auxiliary biasing designed for zero error at $V_{IN} = 0.3$ V) is shown in FIGS. 2A-B. FIG.

2A shows an example of VOUT vs. VIN results of a computer simulation of the RF peak-detector circuits of FIGS. 1A and 1B. FIG. 2B shows an example of relative percentage error vs. VIN results of a computer simulation of the RF peak-detector circuits of FIGS. 1A and 1B.

Unlike the circuit 100A in FIG. 1A without the auxiliary biasing, the circuit 100B in FIG. 1b with the auxiliary biasing has excellent accuracy (e.g., relative error below 4%) in the entire [50 mV, 500 mV] range. If the effect of $R_1$ and $R_2$ remains negligible, scaling of this circuit 100B by a factor $K_S$ for maintaining performance essentially unchanged at other currents can be done by using $K_S I_0$, $R_E/K_S$, $K_S C_1$, and $K_S C_2$ in lieu of $I_0$, $R_E$, $C_1$, and $C_2$, respectively.

Figure 3A:
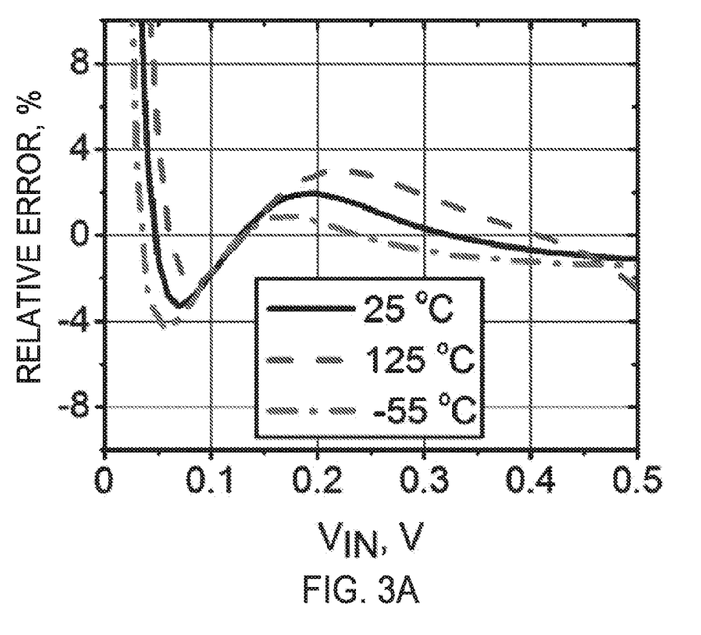
FIG. 3A shows an example of relative percentage error vs. VIN results of a computer simulation of the RF peak detector circuits of FIGS. 1A and 1B using constant primary and auxiliary bias currents, Io.
Figure 3B:
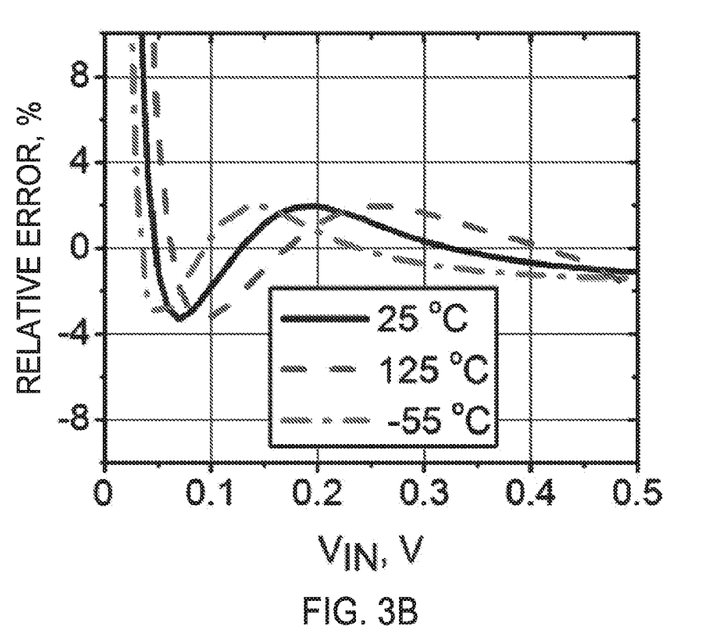
FIG. 3B shows an example of relative percentage error vs. VIN results of a computer simulation of the RF peak detector circuits of FIGS. 1A and 1B using proportional-to-absolute-temperature (PTAT) primary and auxiliary bias currents, Io.

The relative error of the circuit 100B of FIG. 1b using the final optimized circuit parameters at 25° C., but varying the temperature in a wide range (−55° C. . . . 125° C.) is shown in FIGS. 3A-3B, for constant and proportional-to-absolute-temperature (PTAT) $I_0$ bias currents. FIG. 3A shows an example of relative percentage error vs. VIN results of a computer simulation of the RF peak detector circuits of FIGS. 1A and 1B using constant primary and auxiliary bias currents, Io. FIG. 3B shows an example of relative percentage error vs. VIN results of a computer simulation of the RF peak detector circuits of FIGS. 1A and 1B using proportional-to-absolute-temperature (PTAT) primary and auxiliary bias currents, Io. For PTAT currents, the errors are smaller and with practically equal local maxima and minima, which can be explained by the nature of the error term in (1) and the large-signal compensating characteristic of the circuit around $Q_3$-$Q_4$, which are now both pegged to the thermal voltage $V_T$.

Figure 4:
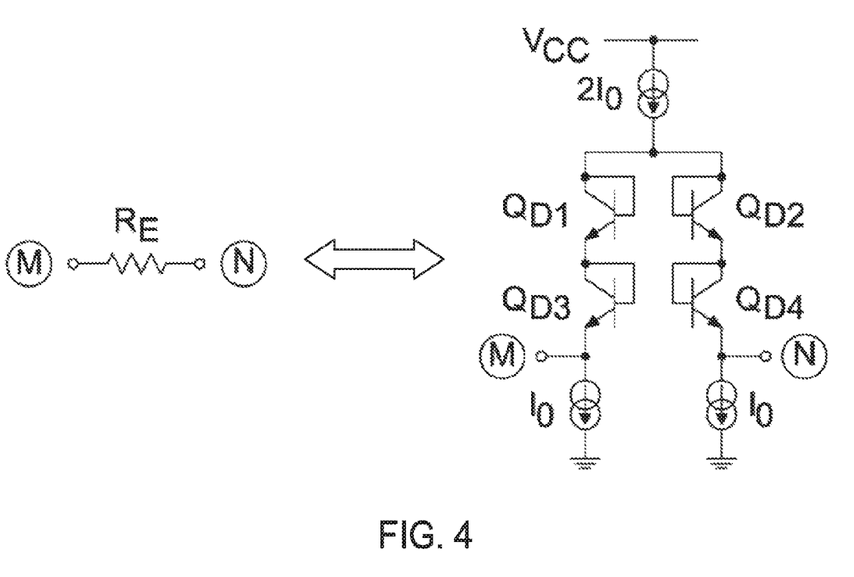
FIG. 4 shows an example of an implementation of the equivalent resistance circuit RE using a pair of legs of series-connected diode-connected transistors, with the legs biased individually by respective current sources, Io, to the lower power supply rail, shown as ground, and biased collectively by a shared current source 2Io from the upper power supply rail Vcc.
Figure 5:
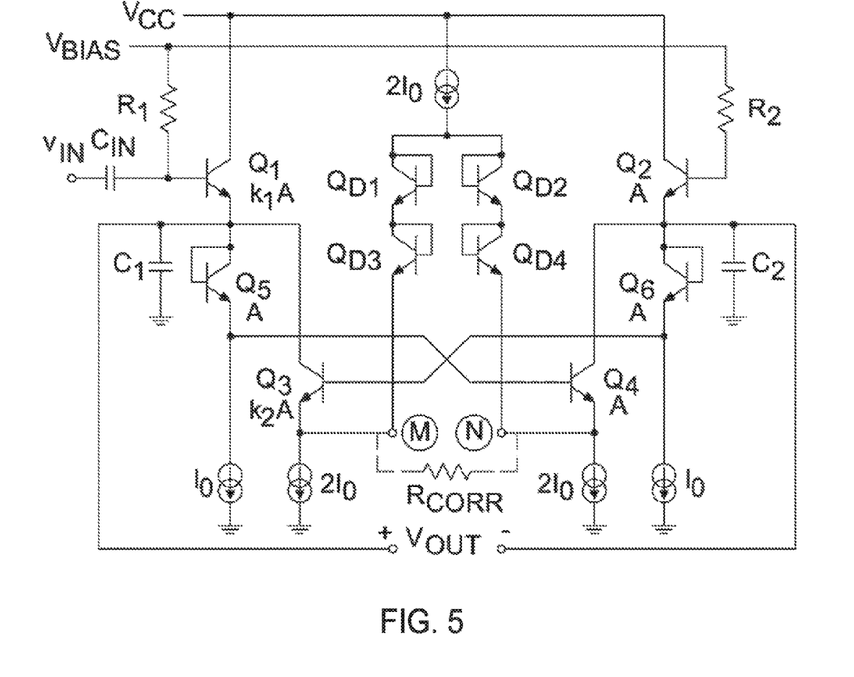
FIG. 5 shows an example of the circuit 100B, including the diode-connected transistor equivalent resistor circuit of FIG. 4, and further including voltage level-shifting transistors Q5, Q6 respectively located between the respective emitters of Q1, Q2 and the respective base terminals of Q4, Q3.

FIG. 4 shows an example of an implementation of the equivalent resistance circuit $R_E$ using a pair of legs of series-connected diode-connected transistors, with the legs biased individually by respective current sources, Io, to the lower power supply rail, shown as ground, and biased collectively by a shared current source $2I_0$ from the upper power supply rail Vcc. If pnp or PFET transistors are available for implementing a current source $2I_0$ (rather than a sink), the subcircuit 104 of FIG. 4 using like diode-connected transistors $Q_{D1}$-$Q_{D4}$ can replace the equivalent resistance circuit $R_E$ of FIG. 1, such as shown in FIG. 5. Despite its nonlinear nature, the diode subcircuit in FIG. 4 behaves in much the same way as resistor $R_E$, and can have a value close to optimal at any current $I_0$ ($R_{Eoptimal} \cong R_{MN} = 4 V_T/I_0$ at small voltages between M and N)

FIG. 5 shows an example of the circuit 100B, including the diode-connected transistor equivalent resistor circuit of FIG. 4, and further including voltage level-shifting transistors Q5, Q6 respectively located between the respective emitters of Q1, Q2 and the respective base terminals of Q4, Q3. An extended range can be achieved with the circuit of FIG. 5, such as by using $Q_5$, $Q_6$ as such voltage level shifters, such as for avoiding the saturation of Q3, Q4, and using $V_{CC} \geq V_{BIAS} + 0.5$ V for avoiding the saturation of $Q_1$, $Q_2$. The respective primary bias currents Io can be provided to the transistors Q1, Q2 via the respective diode-connected level shifting transistors Q4, Q6, which can be respectively located in series between the bias current circuits and the emitters of the transistors Q1, Q2.

Figure 6A:
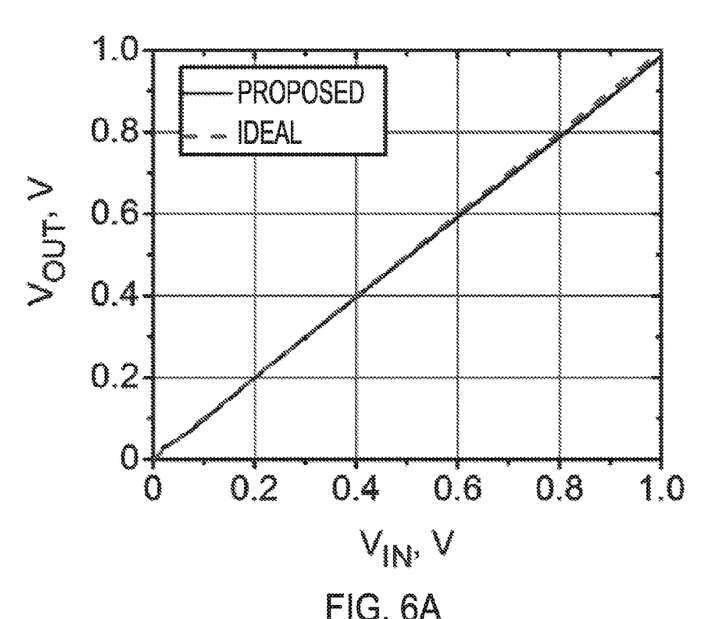
FIG. 6A shows an example of VOUT vs. VIN results of a computer simulation of the RF peak-detector circuits of FIG. 5.
Figure 6B:
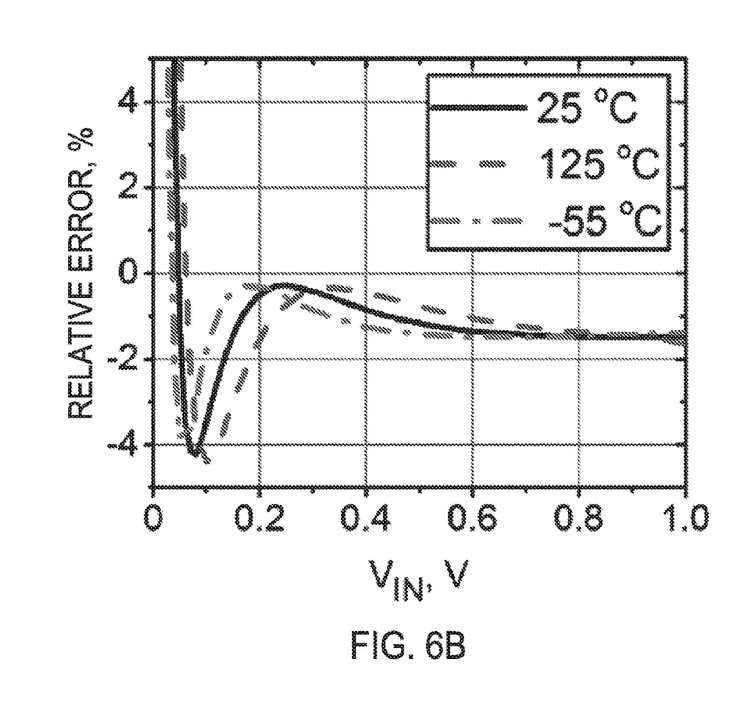
FIG. 6B shows an example of relative percentage error vs. VIN results of a computer simulation of the RF peak-detector circuits of FIG. 5.

FIG. 6A shows an example of VOUT vs. VIN results of a computer simulation of the RF peak-detector circuits of FIG. 5. FIG. 6B shows an example of relative percentage error vs. VIN results of a computer simulation of the RF peak-detector circuits of FIG. 5. The performance of the circuit of FIG. 5, using the same simulator-optimized $k_1=3$ and $k_2=6$ found for the circuit of FIG. 1b, is shown in FIG. 6 for $V_{IN}$ in the larger range [50 mV, 1V], using $I_0=100$ μA, and remains exceptionally good over temperature for constant (non-PTAT) $I_0$. In addition, the performance does not depend on resistors, and involves only the scaling of $C_1$, $C_2$ (to $K_S C_1$ and $K_S C_2$, respectively), when $I_0$ is scaled to $K_S I_0$. A correction resistance $R_{CORR}$ ($\gg 4 V_T/I_0$) can be added, such as shown, between nodes M and N in FIG. 5 for a further (but relatively modest) error reduction.

Figure 7:
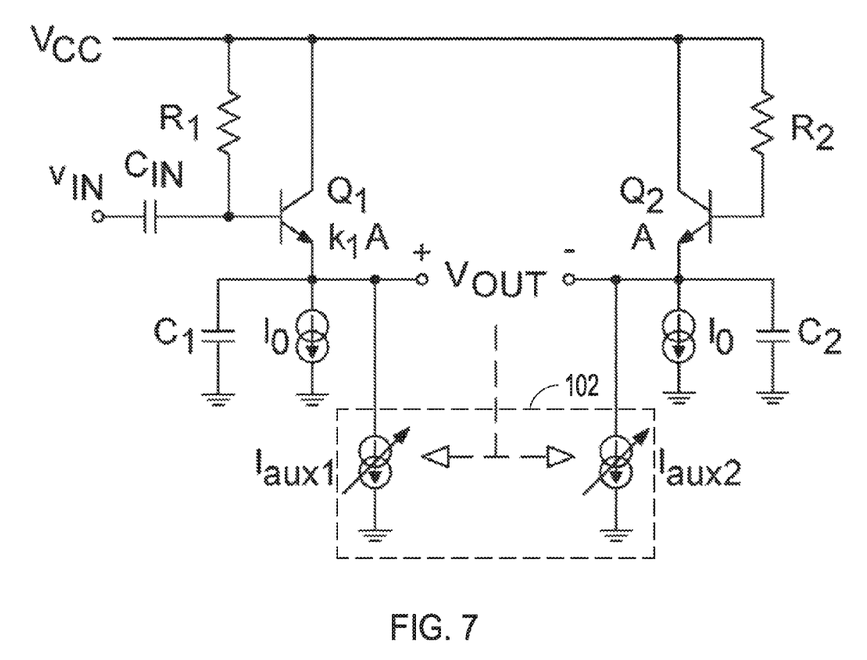
FIG. 7 shows an example of portions of the present RF peak-detector circuit, with primary biasing and also including a more general version of auxiliary biasing.

FIG. 7 shows an example of portions of the present RF peak-detector circuit, with primary biasing and also including a more general representation of the auxiliary biasing circuit 102. FIG. 7 illustrates that the auxiliary biasing can include voltage-dependent current sources connected to the respective emitters of Q1, Q2, with the value of the auxiliary biasing current being provided to the respective transistors Q1, Q2 being provided as a function of the output voltage, VOUT. As illustrated in more detail in FIG. 1B, these auxiliary bias currents can be provided by a cross-coupled pair of transistors, Q3, Q4, that can adjust the respective auxiliary bias currents being provided to Q1, Q2, such as by shifting the auxiliary bias current from Q1 to Q2 based on the magnitude of the output voltage, VOUT. As explained above, this can provide additional correction to the error term that depends on the thermal voltage and the input signal voltage. Control for the voltage-dependent auxiliary bias current circuits shown in FIG. 7 can be provided using circuits other than that shown in FIG. 1B, however, the circuit shown in FIG. 1B provides a convenient and robust implementation that does not require a large number of additional components, but it can still provide good accuracy at and near the ends of the input voltage range, and accurate interpolation therebetween.

Figure 8:
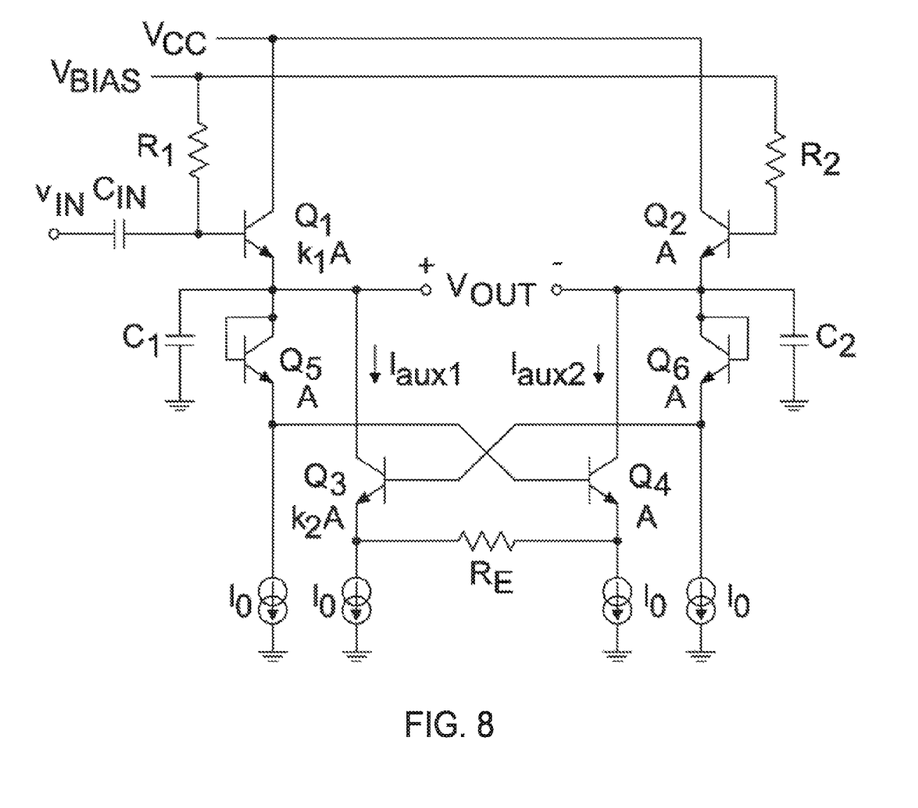
FIG. 8 shows an example of portions of the present RF peak-detector circuit, with level-shifting, such as shown in FIG. 5, but with a more general representation of the equivalent resistance circuit $R_E$.

FIG. 8 shows an example of portions of the present RF peak-detector circuit, with level-shifting diodes or diode-connected transistors, such as shown in FIG. 5, but with a more general representation of the equivalent resistance circuit $R_E$, which need not be implemented by the particular equivalent resistance circuit $R_E$ implementations as shown in FIGS. 4-5. As similarly described above with respect to FIG. 5, the RF peak-detector circuit shown in FIG. 8 can further include voltage level-shifting transistors Q5, Q6 respectively located between the respective emitters of Q1, Q2 and the respective base terminals of Q4, Q3. An extended range can be achieved with the circuit of FIG. 5, such as by using $Q_5$, $Q_6$ as such voltage level shifters, such as for avoiding the saturation of $Q_3$, $Q_4$, and using $V_{CC} \geq V_{BIAS} + 0.5$ V for avoiding the saturation of $Q_1$, $Q_2$. The respective primary bias currents Io can be provided to the transistors Q1, Q2 via the respective diode-connected level shifting transistors Q4, Q6, which can be respectively located in series between the bias current circuits and the emitters of the transistors Q1, Q2.

Figure 9:
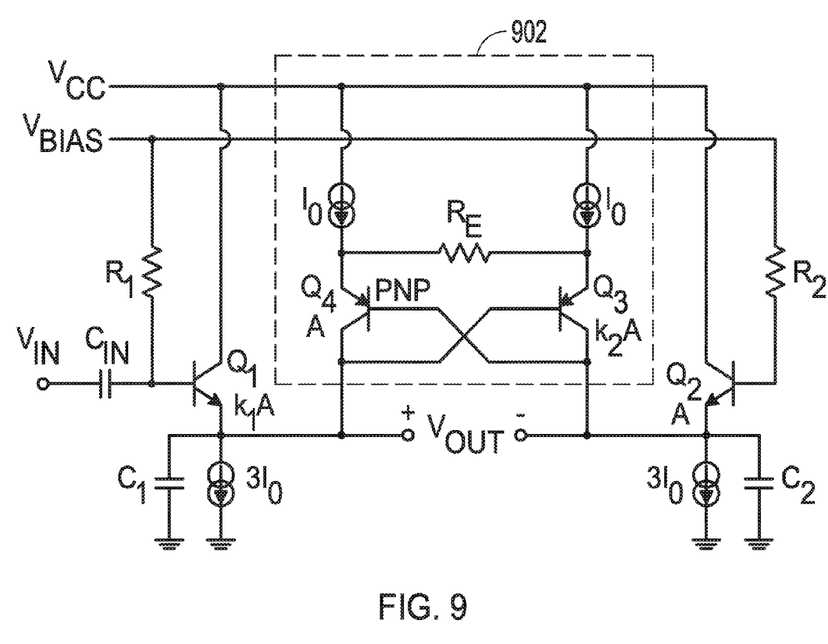
FIG. 9 shows an example of portions of the present RF peak-detector circuit, with an auxiliary bias current circuit that can include Q3, Q4 being implemented as pnp BJTs sourcing respective auxiliary currents, rather than sinking respective auxiliary currents such as in FIGS. 1b, 5, and 7-8.

FIG. 9 shows an example of portions of the present RF peak-detector circuit, with an auxiliary bias current circuit 902 that can include Q3, Q4 being implemented as pnp BJTs sourcing respective auxiliary currents, rather than sinking respective auxiliary currents such as in FIGS. 1b, 5, and 7-8. In the example of FIG. 9, Q1 and Q2 can be respectively biased with 3Io sunk from their respective emitters. Q3 can have its collector electrically connected to the emitter of Q2 and its base connected to the emitter of Q1. Q4 can have its collector connected to the emitter of Q1 and its base connected to the emitter of Q2. Thus, Q3 and Q4 can be cross-coupled. The respective emitters of Q3, Q4 can be biased with respective current sources, each sourcing a current of Io, and each of which can be biased from an upper power supply rail VCC that is more positive than the VBIAS supply rail serving the rest of the circuitry. This can help maintain such current sources with adequate voltage across them to operate in a FET saturation region, for example. An equivalent resistance circuit $R_E$ can be located between the emitters of Q3, Q4. Q3 can be larger than Q4, such as having k2 times the base-emitter area A of Q4, while Q1 can be larger than Q2, such as having k1 times the base-emitter area A of Q2. The base-emitter areas A of Q2 and Q4 need not be identical. In this example, the emitters of Q1 and Q2 can each be respectively biased with a primary bias current of 3Io, which can be drawn from each emitter and sunk to ground. The auxiliary currents can source Io to each emitter terminal, such as when VOUT is minimal, such that the bias current through Q1 can vary between Io (when all auxiliary bias current is steered toward Q1 by the cross-coupled Q3, Q4) and 2Io (when the auxiliary bias currents are equally steered toward Q1 and Q2 by the cross-coupled Q3. Q4). In the example of FIG. 9, correction or compensation of the error term that depends on the thermal voltage and the input signal voltage at a low input signal level can be achieved by the mismatched or scaled areas of Q1, Q2. At a high input signal level, such correction or compensation of the error term that depends on the thermal voltage and the input signal voltage can be achieved by the auxiliary biasing circuit 902, which can include the cross-coupled and mismatched or scaled Q3, Q4, the equivalent resistance circuit $R_E$, and the bias current sources providing Io.

The proposed peak detectors can involve using larger supply/bias voltages than the certain other circuits for maintaining all transistors and current sources/sinks in the active region, but the currents can be scaled to be on the same order as in such other detector circuits for low power. In practice, component imperfections and mismatches can affect performance to some degree, but the fundamental proposed circuits are robust and convenient to build, and can provide excellent accuracy.

To recap, a robust concept for achieving increased accuracy in an RF peak detector over a wide sinusoidal-signal range has been described and validated in circuit simulation. At least four detailed circuit variants have been described. The errors of the proposed circuits are small at least down to input amplitudes approximately equal to $2V_T$.

Various Notes

This document refers to transistor "conduction terminals" and "control terminals." A conduction terminal can include a collector terminal or an emitter terminal of a bipolar junction transistor, for example, or a drain terminal or a source terminal of a field-effect transistor. A control terminal can include a base terminal of a bipolar junction transistor, or a gate terminal or a back-gate terminal of a field effect transistor.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A radio-frequency (RF) peak-detector circuit, comprising:
a signal input stage including first and second transistors across which an output voltage is produced in response to an input signal voltage received via the first transistor, the first and second transistors having respective bias currents and scaled sizes that, at a first value of the output voltage, offset an error term that depends on a thermal voltage and the input signal voltage; and
first and second auxiliary bias current circuits respectively coupled to a corresponding one of the first and second transistors, the first and second auxiliary bias current circuits providing respective voltage-dependent auxiliary bias currents that are a function of the output voltage across the first and second transistors selected to offset, at a second value of the output voltage that is different from the first value of the output voltage, the error term that depends on the thermal voltage and the input signal voltage.

2. The RF peak-detector circuit of claim 1, wherein the first and second auxiliary bias current circuits are configured to provide respective voltage-dependent auxiliary bias currents that are a function of the output voltage across the first and second transistors selected to offset, at two different values of the output voltage corresponding to (1) an input voltage near a minimum input voltage and to (2) an input voltage near a maximum input voltage, the error term that depends on the thermal voltage and the input signal voltage.

3. The RF peak-detector circuit of claim 1, wherein the first and second auxiliary bias current circuits together include:
third and fourth transistors having respective bias currents and scaled sizes that are selected to provide, to the first and second transistors respectively, similar-valued auxiliary bias currents when the output voltage is minimal; and
wherein the third and fourth transistors are cross-coupled, such that a control terminal of the third transistor is coupled to a conduction terminal of the fourth transistor and a control terminal of the fourth transistor is coupled to a conduction terminal of the third transistor.

4. The RF peak-detector circuit of claim 3, wherein:
each of the first, second, third, and fourth transistors are respectively connected to and biased with a like-valued primary bias current, $I_o$; and
the third transistor is connected to provide its auxiliary bias current to the first transistor, and the fourth transistor is connected to provide its auxiliary bias current to the second transistor.

5. The RF-peak detector circuit of claim 4, wherein:
the first transistor is scaled to have a larger effective area than the second transistor; and
the third transistor is scaled to have a larger effective area than the fourth transistor.

6. The RF peak-detector circuit of claim 4, wherein:
the third and fourth transistors are cross-coupled, and include a base terminal of the third transistor is coupled to a collector terminal of the fourth transistor and a base terminal of the fourth transistor is coupled to a collector terminal of the third transistor; and
the collector terminal of the third transistor is coupled to an emitter terminal of the first transistor, and the collector terminal of the fourth transistor is coupled to an emitter terminal of the second transistor; and
further comprising an equivalent resistance circuit connecting an emitter terminal of the third transistor to an emitter terminal of the fourth transistor.

7. The RF peak-detector circuit of claim 6, wherein the equivalent resistance circuit includes a pair of leg circuits including diode-connected transistors, respectively individually connected to and biased with similar-valued individual bias currents and collectively connected to and biased with a shared biased current selected as the sum of the individual bias currents.

8. The RF peak-detector circuit of claim 1, further comprising:
a first level-shifter circuit between the first transistor and the first auxiliary bias current circuit; and
a second level-shifter circuit between the second transistor and the second auxiliary bias current circuit.

9. The RF peak-detector circuit of claim 8, wherein the first and second level shifter circuits each comprise a corresponding diode-connected transistor.

10. The RF peak-detector circuit of claim 1, wherein the first and second auxiliary bias current circuits together include:
third and fourth transistors that are cross-coupled, and include a base terminal of the third transistor is coupled to a collector terminal of the fourth transistor and a base terminal of the fourth transistor is coupled to a collector terminal of the third transistor; and
wherein the first, second, third, and fourth transistors are all NPN bipolar junction transistors, wherein an emitter terminal of the first transistor is coupled to the collector terminal of the third transistor, and wherein an emitter terminal of the second transistor is coupled to the collector terminal of the fourth transistor.

11. The RF peak-detector circuit of claim 1, wherein the first and second auxiliary bias current circuits together include:
third and fourth transistors that are cross-coupled, and include a base terminal of the third transistor is coupled to a collector terminal of the fourth transistor and a base terminal of the fourth transistor is coupled to a collector terminal of the third transistor; and
wherein the first and second transistors are NPN bipolar junction transistors and the third and fourth transistors are PNP bipolar junction transistors, wherein an emitter terminal of the first transistor is coupled to a base terminal of the third transistor and to the collector terminal of the fourth transistor, and wherein an emitter terminal of the second transistor is coupled to a base terminal of the fourth transistor and to the collector terminal of the third transistor.

12. The RF peak-detector circuit of claim 11, wherein the first and second transistors are respectively biased with primary currents sinking $3I_o$ from each respective emitter of the first and second transistors, and wherein the third and fourth transistors collectively source a sum of $2I_o$ to, and variably divided between, the emitters of the first and second transistors.

13. A radio-frequency (RF) peak-detection method, comprising:
receiving an input signal voltage at a signal input stage including first and second transistors across which an output voltage is produced in response to the input signal voltage received via the first transistor;

biasing respective primary bias currents of the first and second transistors to offset, at a first value of the output voltage, an error term that depends on a thermal voltage and the input signal voltage; and biasing respective auxiliary bias currents of the first and second transistors using respective voltage-dependent auxiliary bias currents that are a function of the output voltage across the first and second transistors selected to offset, at a second value of the output voltage that is different from the first value of the output voltage, the error term that depends on the thermal voltage and the input signal voltage.

14. The RF peak-detection method of claim 13, comprising:

providing the first and second auxiliary bias currents as respective voltage-dependent auxiliary bias currents that are a function of the output voltage across the first and second transistors selected to offset, at two different values of the output voltage corresponding to (1) an input voltage near a minimum input voltage and to (2) an input voltage near a maximum input voltage, the error term that depends on the thermal voltage and the input signal voltage.

15. The RF peak-detection method of claim 13, comprising:

providing wherein the first and second auxiliary bias currents using cross-coupled third and fourth transistors having respective bias currents and scaled sizes that are selected to provide, to the first and second transistors respectively, similar-valued auxiliary bias currents when the output voltage is minimal.

16. The RF peak-detection method of claim 15, wherein:

biasing each of the first, second, third, and fourth transistors with a like-valued primary bias current, $I_o$; and using the third transistor to provide an auxiliary bias current to the first transistor, and using the fourth transistor to provide an auxiliary bias current to the second transistor, wherein the first transistor is scaled to have a larger effective area than the second transistor, and wherein the third transistor is scaled to have a larger effective area than the fourth transistor.

17. The RF peak-detection method of claim 15, comprising:

providing an equivalent resistance circuit connecting an emitter terminal of the third transistor to an emitter terminal of the fourth transistor.

18. The RF peak-detection method of claim 15, comprising:

level-shifting a voltage between the first and third transistors;

level-shifting a voltage between the second and fourth transistors.

19. A radio-frequency (RF) peak-detector circuit, comprising:

a signal input stage including first and second transistors across which an output voltage is produced in response to an input signal voltage received via the first transistor, the first and second transistors having respective bias currents and scaled sizes that, at a first value of the output voltage, offset an error term that depends on a thermal voltage and the input signal voltage; and first and second auxiliary bias current circuits respectively coupled to a corresponding one of the first and second transistors, wherein the first and second auxiliary bias current circuits are configured to provide respective voltage-dependent auxiliary bias currents that are a function of the output voltage across the first and second transistors selected to offset, at two different values of the output voltage corresponding to (1) an input voltage near a minimum input voltage and to (2) an input voltage near a maximum input voltage, the error term that depends on the thermal voltage and the input signal voltage.

20. The RF peak-detector circuit of claim 19, wherein the first and second auxiliary bias current circuits together include:

third and fourth transistors having respective bias currents and scaled sizes that are selected to provide, to the first and second transistors respectively, like auxiliary bias currents when the output voltage is minimal; and wherein the third and fourth transistors are cross-coupled, such that a control terminal of the third transistor is coupled to a conduction terminal of the fourth transistor and a control terminal of the fourth transistor is coupled to a conduction terminal of the third transistor.

* * * * *